（12） United States Patent
Yuwaki et al.

(10) Patent No.: US 11,962,124 B2
(45) Date of Patent: Apr. 16, 2024

(54) DETECTION CIRCUIT, DRIVING CIRCUIT, AND LIGHT EMITTING DEVICE

(71) Applicant: Sony Semiconductor Solutions Corporation, Kanagawa (JP)

(72) Inventors: Takeshi Yuwaki, Kagoshima (JP); Mitsushi Tabata, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 529 days.

(21) Appl. No.: 17/292,545

(22) PCT Filed: Oct. 18, 2019

(86) PCT No.: PCT/JP2019/041008
§ 371 (c)(1),
(2) Date: May 10, 2021

(87) PCT Pub. No.: WO2020/100518
PCT Pub. Date: May 22, 2020

(65) Prior Publication Data
US 2022/0006259 A1    Jan. 6, 2022

(30) Foreign Application Priority Data
Nov. 16, 2018  (JP) ................................ 2018-216049

(51) Int. Cl.
*H01S 5/042*        (2006.01)
*H01S 5/42*         (2006.01)
*H03F 3/45*         (2006.01)

(52) U.S. Cl.
CPC .............. *H01S 5/042* (2013.01); *H01S 5/423* (2013.01); *H03F 3/45179* (2013.01)

(58) Field of Classification Search
CPC ....... H01S 5/042–0428; H01S 5/06808; H01S 5/423; H01S 5/42–426;
(Continued)

(56) References Cited

U.S. PATENT DOCUMENTS 5,459,328 A * 10/1995 Kadota ................. H05B 47/23
                                                    250/214 A
5,793,786 A *  8/1998 Furumiya .............. H01S 5/042
                                                    372/38.02
(Continued)

FOREIGN PATENT DOCUMENTS

CN      101785118 A      7/2010
CN      102045922 A      5/2011
(Continued)

OTHER PUBLICATIONS

International Search Report (PCT/ISA/210), International Application No. PCT/JP2019/041008, dated Jan. 7, 2020.
(Continued)

*Primary Examiner* — Joshua King
(74) *Attorney, Agent, or Firm* — Michael Best & Friedrich LLP

(57) ABSTRACT

A detection circuit (20) according to the present disclosure includes a multiple-input one-output operational amplifier (30). The operational amplifier (30) includes a first transistor group (31) and a second transistor (32). The first transistor group (31) includes plural transistors connected in parallel such that operating voltages for plural light emitting elements (5) are inputted individually to gates of the plural transistors, the gates being non-negated input terminals of the operational amplifier. The second transistor (32) cooperates with the first transistor group (31) to form a differential configuration and has a gate which is a negated input terminal of the operational amplifier and to which an output from an output terminal is negatively fed back.

10 Claims, 7 Drawing Sheets

(58) Field of Classification Search
CPC ......... H01S 5/4025–4093; H05B 45/52; H03F 3/45179
See application file for complete search history.

(56) References Cited

U.S. PATENT DOCUMENTS

| | | | | |
|---|---|---|---|---|
| 5,796,714 | A * | 8/1998 | Chino | H01S 5/18305 372/96 |
| 5,966,394 | A * | 10/1999 | Spurr | H01S 5/042 372/34 |
| 6,005,262 | A * | 12/1999 | Cunningham | H01S 5/02325 257/435 |
| 6,456,641 | B1 * | 9/2002 | Hauer | H01S 5/0239 372/38.07 |
| 8,018,170 | B2 * | 9/2011 | Chen | H05B 45/325 315/192 |
| 8,729,870 | B2 * | 5/2014 | Crawford | H05B 45/3725 323/272 |
| 8,837,539 | B1 * | 9/2014 | Sun | H01S 5/06832 372/38.07 |
| 9,300,113 | B2 * | 3/2016 | Hoffman | H01S 5/0428 |
| 9,370,082 | B2 * | 6/2016 | Yoneoka | H05B 45/58 |
| 9,570,883 | B2 * | 2/2017 | Zarbock | G02B 6/4269 |
| 9,876,328 | B1 * | 1/2018 | Wappis | H05B 45/10 |
| 2003/0039280 | A1 * | 2/2003 | Mangano | H01S 5/0428 372/38.02 |
| 2003/0189961 | A1 * | 10/2003 | Tsuji | H01S 5/042 372/38.02 |
| 2003/0205949 | A1 * | 11/2003 | Rueger | F02D 41/221 310/316.03 |
| 2005/0058389 | A1 * | 3/2005 | Ouchi | G02B 6/4292 385/14 |
| 2007/0116075 | A1 * | 5/2007 | Fujita | G11B 7/126 |
| 2007/0241354 | A1 * | 10/2007 | Tanaka | H01S 5/04257 257/E33.001 |
| 2008/0048567 | A1 * | 2/2008 | Steele | H04N 1/40056 315/151 |
| 2008/0253418 | A1 * | 10/2008 | Egawa | H04N 9/3129 372/38.02 |
| 2010/0201283 | A1 | 8/2010 | Kawata et al. | |
| 2011/0210352 | A1 | 9/2011 | Lee et al. | |
| 2011/0227489 | A1 * | 9/2011 | Huynh | H05B 45/14 315/185 R |
| 2012/0033692 | A1 * | 2/2012 | Schleuning | H01S 5/041 372/75 |
| 2012/0212143 | A1 * | 8/2012 | Esaki | H05B 45/52 315/192 |
| 2013/0293122 | A1 * | 11/2013 | Huynh | H05B 45/59 315/185 R |
| 2014/0168567 | A1 | 6/2014 | Kikuchi et al. | |
| 2014/0211192 | A1 * | 7/2014 | Grootjans | H02M 7/42 356/5.01 |
| 2014/0265839 | A1 * | 9/2014 | Anand | H05B 45/58 315/77 |
| 2014/0269799 | A1 * | 9/2014 | Ortiz | H01S 5/0428 372/38.02 |
| 2014/0269804 | A1 * | 9/2014 | Lai | G02B 6/4206 372/50.21 |
| 2015/0053163 | A1 * | 2/2015 | Bolz | F02P 23/04 372/38.03 |
| 2015/0327338 | A1 * | 11/2015 | Hui | H05B 45/46 323/317 |
| 2016/0349304 | A1 | 12/2016 | Sartori et al. | |
| 2017/0162128 | A1 * | 6/2017 | Kimura | G09G 3/342 |
| 2017/0214374 | A1 * | 7/2017 | Tajalli | H03G 3/3089 |
| 2018/0083419 | A1 | 3/2018 | Lee | |
| 2018/0191306 | A1 * | 7/2018 | Ivanov | H03F 3/45475 |
| 2018/0278011 | A1 * | 9/2018 | Galvano | G01S 7/4813 |

FOREIGN PATENT DOCUMENTS

| | | | | |
|---|---|---|---|---|
| CN | 105027678 | A | 11/2015 | |
| CN | 105759369 | B * | 3/2018 | .......... G02B 6/3895 |
| CN | 105027678 | B * | 7/2018 | .............. G05F 3/16 |
| CN | 108259013 | A | 7/2018 | |
| DE | 19618010 | C1 * | 7/1997 | .............. B60Q 1/38 |
| DE | 102016226260 | A1 * | 6/2017 | .............. B60Q 1/34 |
| EP | 2866526 | A1 * | 4/2015 | .......... H05B 33/083 |
| JP | 2001068795 | A * | 3/2001 | ................ B41J 2/45 |
| JP | 2001069404 | A | 3/2001 | |
| JP | 2003017800 | A | 1/2003 | |
| JP | 2006218290 | A * | 8/2006 | |
| JP | 2006278403 | A * | 10/2006 | |
| JP | 2009-044081 | A | 2/2009 | |
| JP | 2011-181925 | A | 9/2011 | |
| JP | 2011199079 | A * | 10/2011 | |
| JP | 2012-204075 | A | 10/2012 | |
| JP | 2013131348 | A * | 7/2013 | |
| JP | 2016-509748 | A | 3/2016 | |
| JP | 2017056854 | A * | 3/2017 | |
| JP | 2017208195 | A * | 11/2017 | ............. G01R 31/02 |
| KR | 102499936 | B1 * | 2/2023 | |
| TW | 201419245 | A * | 5/2014 | ......... H05B 33/0824 |
| TW | 201426239 | A * | 7/2014 | .............. G05F 3/16 |
| WO | WO-03026082 | A2 * | 3/2003 | ......... G02B 19/0014 |
| WO | WO-03061347 | A1 * | 7/2003 | ......... H05B 33/0803 |
| WO | WO-2012007309 | A1 * | 1/2012 | ............ H01S 5/4093 |
| WO | WO-2014078998 | A1 * | 5/2014 | .............. G05F 3/16 |
| WO | WO-2014208048 | A1 * | 12/2014 | ......... H01S 5/06825 |
| WO | WO-2015145742 | A1 * | 10/2015 | ............. H01S 5/042 |
| WO | 2015/174239 | A1 | 11/2015 | |
| WO | WO-2017154128 | A1 * | 9/2017 | ............. H01S 5/0021 |

OTHER PUBLICATIONS

Notification of Transmittal of the International Search Report and the Written Opinion of the International Searching Authority, or the Declaration (PCT/ISA/220), International Application No. PCT/JP2019/041008, dated Jan. 21, 2020.

Written Opinion of the International Search Authority (PCT/ISA/237), International Application No. PCT/JP2019/041008, dated Jan. 21, 2020.

* cited by examiner

DETECTION CIRCUIT, DRIVING CIRCUIT, AND LIGHT EMITTING DEVICE

TECHNICAL FIELD

The present disclosure relates to a detection. circuit, a driving circuit, and a light emitting device.

BACKGROUND ART

In recent years, a light emitting device in which a large number of (for example, several hundreds) light emitting elements are juxtaposed in an array on one chip like a vertical cavity surface emitting laser (VCSEL) is known (for example, refer to PTL 1).

CITATION LIST

Patent Literature

PTL 1

PCT Patent Publication No. WO2015/174239

SUMMARY

Technical Problem

However, with the technique in the past described above, in a case where an abnormality occurs even with one light emitting element in a light emitting device in which a large number of light emitting elements are provided, it is difficult to detect the abnormality.

Therefore, the present disclosure proposes a detection circuit, a driving circuit, and a light emitting device that can detect an abnormality in the case where the abnormality occurs even with one of a large number of light emitting elements.

Solution to Problem

According to the present disclosure, a detection circuit is provided. The detection circuit includes a multiple-input one-output operational amplifier. The operational amplifier includes a first transistor group and a second transistor. The first transistor group includes plural transistors connected in parallel such that operating voltages for plural light emitting elements are inputted individually to gates of the plural transistors, the gates being non-negated input terminals of the operational amplifier. The second transistor cooperates with the first transistor group to form a differential configuration and has a gate which is a negated input terminal of the operational amplifier and to which an output from an output terminal is negatively fed back.

Advantageous Effect of Invention

According to the present disclosure, in the case where an abnormality occurs even with one of a large number of light emitting elements, such an abnormality as just described can be detected. It is to be noted that the advantageous effect described here is not necessarily restrictive and may be one of other advantageous effects described in the present disclosure.

DESCRIPTION OF EMBODIMENTS

In the following, embodiments of the present disclosure are described in detail with reference to the drawings. It is to be noted that, in the embodiments described below, identical elements are denoted by identical reference signs, and overlapping description of them is omitted.

[Configuration of Light Emitting Device]

Figure 1:
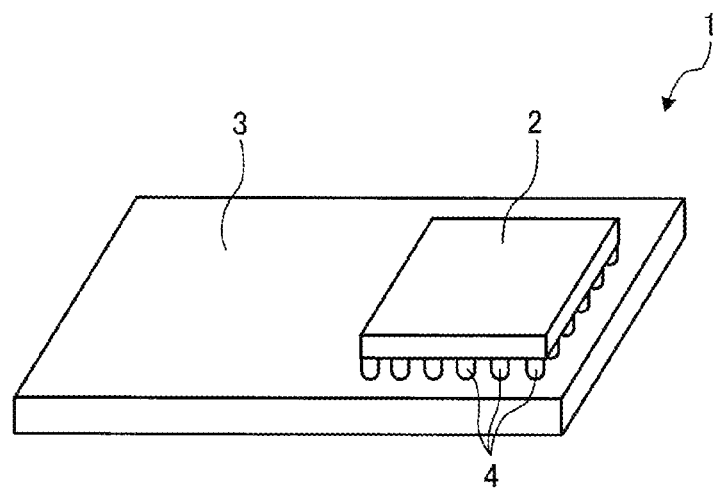
FIG. 1 is a perspective view depicting an example of a configuration of a light emitting device according to an embodiment of the present disclosure.

FIG. 1 is a perspective view of an example of a configuration of a light emitting device 1 according to an embodiment of the present disclosure. As depicted in FIG. 1, the light emitting device 1 includes a light emitting element array 2 and a driving circuit 3.

The light emitting element array 2 includes plural light emitting elements 5 (refer to FIG. 2), Such a light emitting element array 2 as just described may be, for example, a semiconductor laser, and particularly may, possibly be a vertical cavity surface emitting laser (VCSEL). It is to be noted that, in the embodiment, the light emitting element array 2 is not limited to those examples.

The driving circuit 3 includes a circuit for driving the light emitting element array 2. In particular, the driving circuit 3 includes a driving unit 10 for driving the plural light emitting elements 5 individually (refer to FIG. 2). An internal configuration of such a driving circuit 3 as just described is hereinafter described.

Further, in the light emitting device 1 according to the embodiment, the light emitting element array 2 is mounted on a principal surface of the driving circuit 3. Further, the light emitting element array 2 and the driving circuit 3 are mechanically and electrically connected to each other by a plurality of microbumps 4. It is to be noted that the light emitting element array 2 and the driving circuit 3 are not necessarily connected by the microbumps 4.

[Configuration of Driving Circuit]

Figure 2:
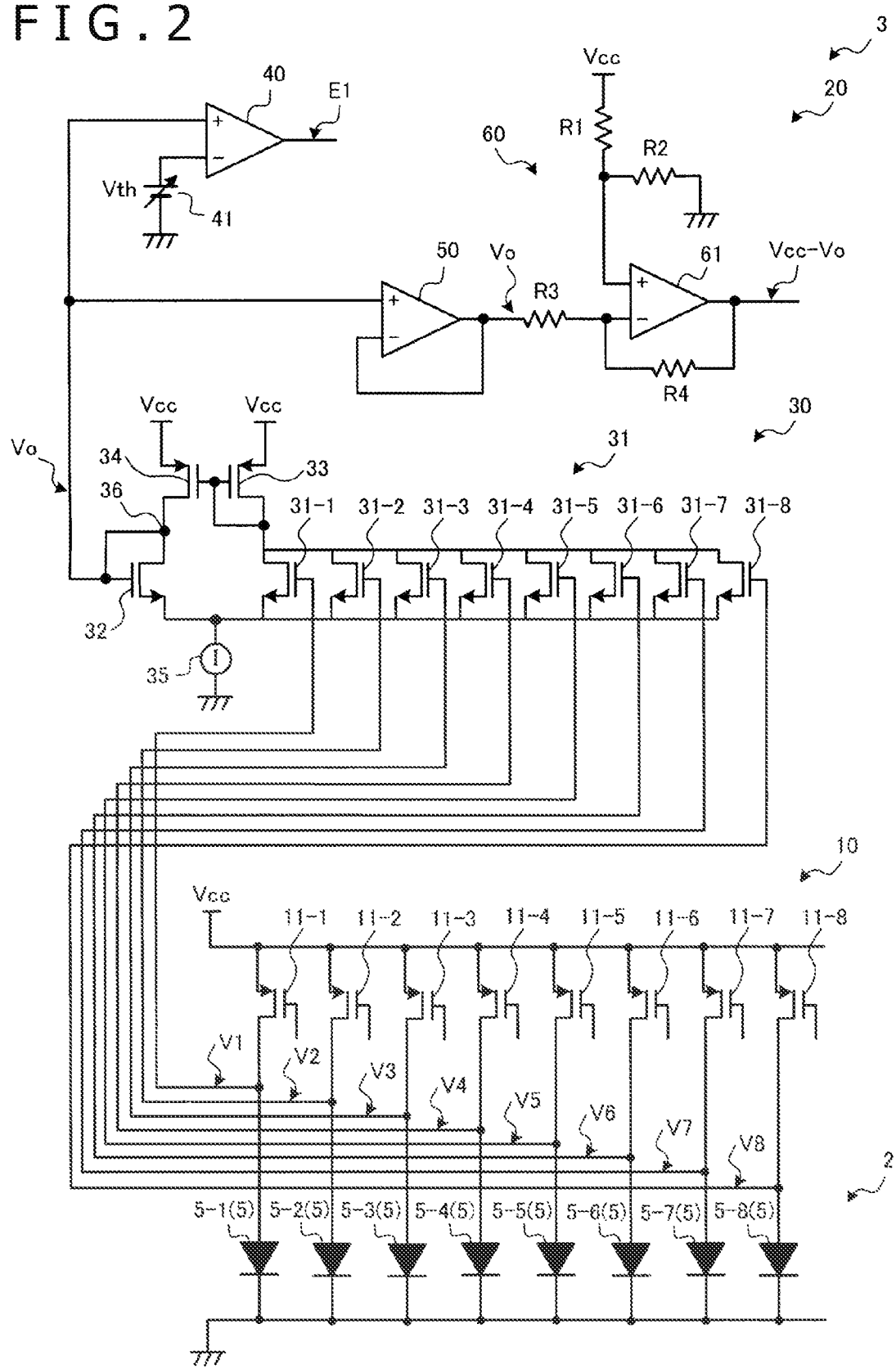
FIG. 2 is a circuit diagram depicting an example of a configuration of a driving circuit according to the embodiment of the present disclosure.

Now, a particular configuration of the driving circuit 3 is described with reference to FIG. 2. FIG. 2 is a circuit diagram depicting an example of a configuration of the driving circuit 3 according to the embodiment of the present disclosure. As depicted in FIG. 2, the driving circuit 3 includes a driving unit 10 and a detection circuit 20.

It is to be noted that the examples in FIGS. 2 to 5 that are described in the followings are directed to a case in which eight light emitting elements 5 (hereinafter referred to as light emitting elements 5-1 to 5-8) are provided on the light emitting element array 2 in order to facilitate understanding.

It is to be noted that, in the embodiment, the number of light emitting elements 5 provided in the light emitting device array 2 is not limited to eight.

The driving unit 10 includes P-type transistors 11-1 to 11-8, which drive the light emitting elements 5-1 to 5-8 by controlling the gate voltage to the P-type transistors 11-1 to 11-8. It is to be noted that the gate voltages for the P-type transistors 11-1 to 11-8 are controlled by a control unit (not depicted) provided in the inside of the driving circuit 3, according to a signal from the outside.

To sources of the P-type transistors 11-1 to 11-8, a power supply voltage Vcc is supplied. Drains of the P-type transistors 11-1 to 11-8 are respectively connected to anodes of light emitting elements 5-1 to 5-8 that are light emitting diodes. Cathodes of the light emitting elements 5-1 to 5-8 are grounded in common. In other words, in the embodiment, the plural light emitting elements 5 are connected in cathode common connection.

Further, from portions between the drains of the P-type transistors 11-1 to 11-8 and the anodes of the light emitting elements 5-1 to 5-8, operating voltages V1 to V8 of the light emitting elements 5-1 to 5-8 are outputted, respectively. Then, the operating voltages V1 to V8 of the light emitting elements 5-1 to 5-S are inputted to the detection circuit 20.

The detection circuit 20 includes an operational amplifier 30, comparators 40 and 50, and a level shift circuit 60. The operational amplifier 30 is a multiple-input one-output operational amplifier, and a first transistor group 31 and a second transistor 32 have a differential configuration relative to each other.

The first transistor group 31 includes the same number of N-type transistors 31-1 to 31-8 as the number of plural light emitting elements 5, the N-type transistors 31-1 to 31-8 being connected in parallel. To drains of the N-type transistors 31-1 to 31-8, the power supply voltage Vcc is supplied through a P-type transistor 33. Meanwhile, sources of the N-type transistors 31-1 to 31-8 are grounded through a constant current source 35.

The second transistor 32 includes N-type transistors. To a drain of the second transistor 32, the power supply voltage Vcc is supplied through a P-type transistor 34. Meanwhile, a source of the second transistor 32 is grounded through the constant current source 35, and a gate of the second transistor 32 is connected to a node 36 between a drain of the P-type transistor 34 and the drain of the second transistor 32.

Meanwhile, a gate of the P-type transistor 33 and a gate of the P-type transistor 34 are connected in common to a portion between a drain of the P-type transistor 33 and the drains of the N-type transistors 31-1 to 31-8. It is to be noted that the P-type transistor 33 and the P-type transistor 34 have sizes equal to each other.

As described above, in the operational amplifier 30 according to the embodiment, the operating voltages V1 to V8 for the light emitting elements 5-1 to 5-8 are respectively inputted to gates of the N-type transistors 31-1 to 31-8 (first transistor group 31), the gates being non-negated input terminals of the operational amplifier 30. Then, in the operational amplifier 30, an output of the operational amplifier 30 is negatively fed back from the node 36 that is an output terminal of the operational amplifier 30 to the gate of the second transistor 32, the gate being a negated input terminal of the operational amplifier 30.

Accordingly, in the embodiment, an output voltage Vo, which has a value that is different between a case in which the operating voltages V1 to V8 of the light emitting elements 5-1 to 5-8 have normal values and another case in which any of the operating voltages V1 to V8 has an abnormal value, is outputted from the output terminal (node 36) of the operational amplifier 30. Next, examples of particular operation of the operational amplifier 30 are described with reference to FIGS. 3 to 5.

Figure 3:
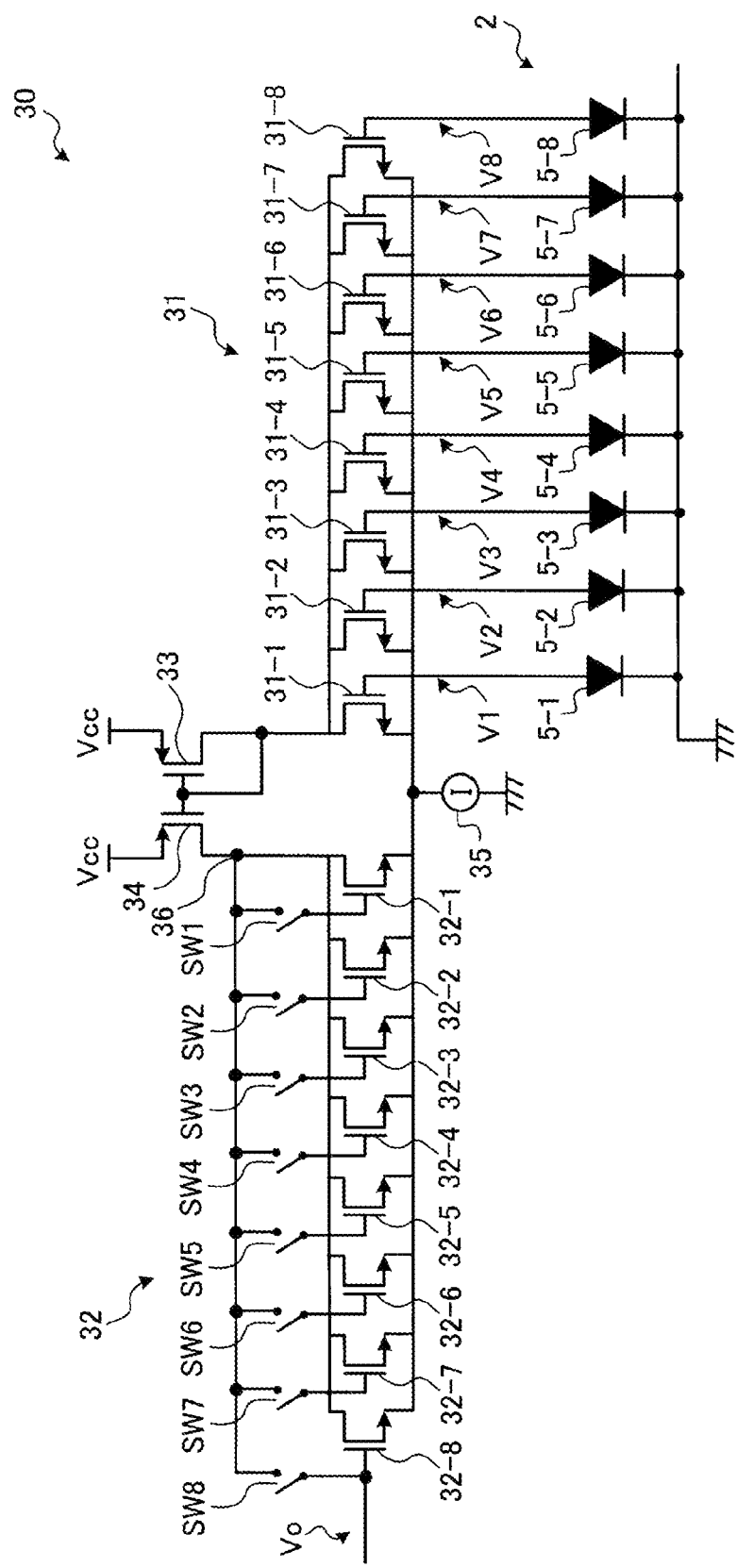
FIG. 3 is a circuit diagram depicting an example of a configuration of an operational amplifier according to the embodiment of the present disclosure.

FIG. 3 is a circuit diagram depicting an example of a configuration of the operational amplifier 30 according to the embodiment of the present disclosure. As depicted in FIG. 3, the gates of the N-type transistors 31-1 to 31-8, the gates being non-negated input terminals of the operational amplifier 30, are connected to the anodes of the light emitting elements 5-1 to 5-8, respectively.

Accordingly, to the gates of the N-type transistors 31-1 to 31-8, the operating voltages V1 to V8 of the light emitting elements 5-1 to 5-8 are inputted, respectively. It is to be noted that, in the embodiment, all of the N-type transistors 31-1 to 31-8 have an equal size.

Further, as depicted in FIG. 3, the second transistor 32 according to the embodiment preferably includes the same number of N-type transistors 32-1 to 32-8 as the number of N-type transistors 31-1 to 31-8, the N-type transistors 32-1 to 32-8 being connected in parallel. To drains of the N-type transistors 32-1 to 32-8, the power supply voltage be is supplied through the P-type transistor 34. Further, the sources of the N-type transistors 32-1 to 32-8 are grounded through the constant current source 35.

Further, in the embodiment, the gates of the N-type transistors 32-1 to 32-8 are connected to the node 36 through switches SW1 to SW8, respectively. The switches SW1 to SW8 are controlled by the abovementioned control unit for controlling the driving circuit 3.

It is to be noted that, in the embodiment, all of the N-type transistors 32-1 to 32-8 have a size equal to that of the N-type transistor 31-1 of the first transistor group 31. In particular, in the embodiment, all of the N-type transistors 31-1 to 31-8 and the N-type transistors 32-1 to 32-8 have an equal size.

Figure 4:
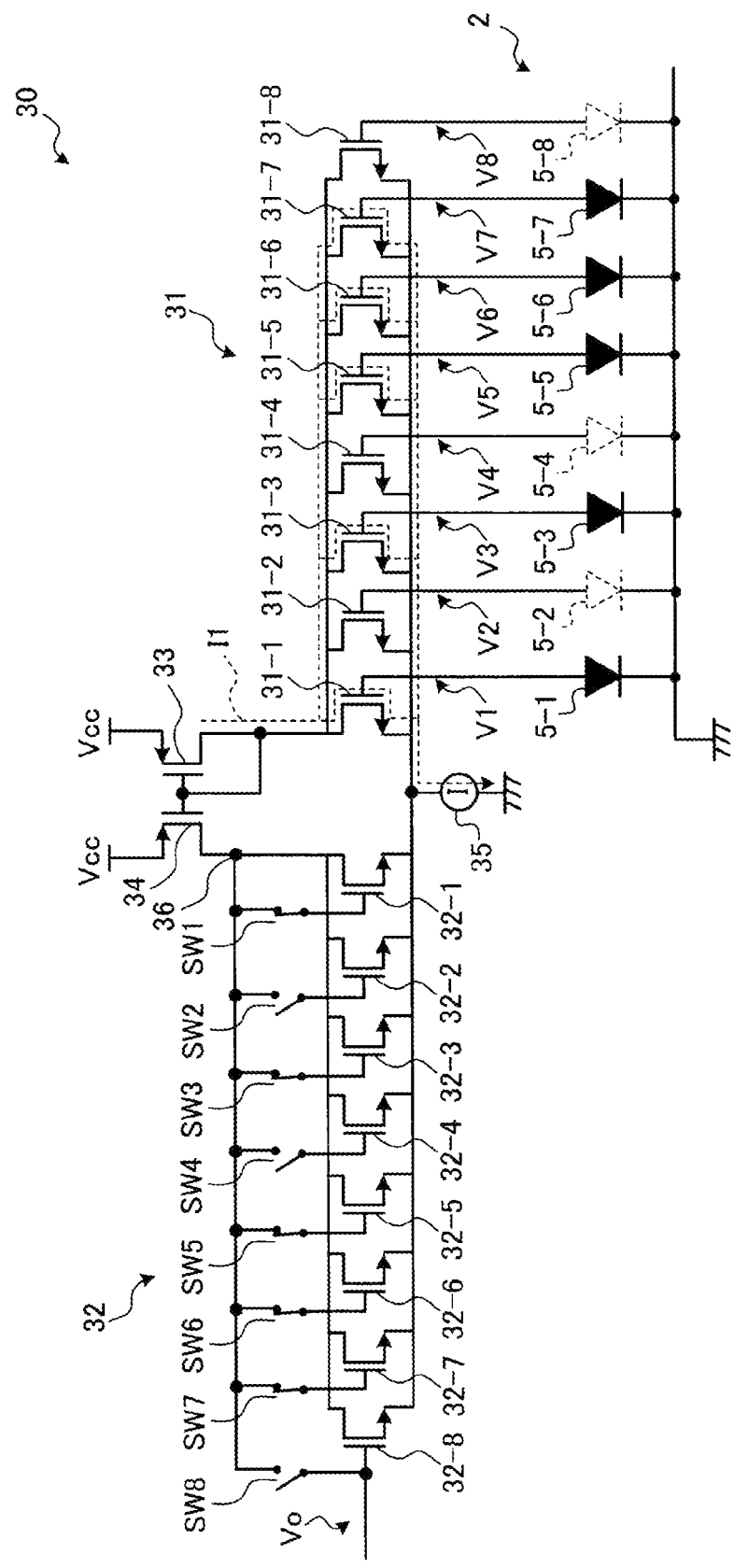
FIG. 4 is a circuit diagram depicting an example of operation of the operational amplifier in a case where light emitting elements according to the embodiment of the present disclosure are normal.

FIG. 4 is a circuit diagram depicting an example of operation of the operational amplifier 30 in the case where the light emitting elements 5 according to the embodiment of the present disclosure are normal. It is to be noted that, in FIGS. 4 and 5, each light emitting element 5 that operates in response to a signal from the outside is indicated by a solid line while each light emitting element 5 that does not operate is indicated by a broken line. In particular, in the example in FIG. 4, the control unit of the driving circuit 3 operates the light emitting elements 5-1, 5-3, and 5-5 to 5-7 but does not operate the light emitting elements 5-2, 5-4, and 5-8.

Here, in the case where all of the light emitting elements 5-1, 5-3, and 5-5 to 5-7 that are operating are normal, the operating voltages V1, V3, and V5 to V7 of them have values equivalent to an operating voltage (for example, 2.2 V) based on specifications and so forth of the light emitting elements 5-1, 5-3, and 5-5 to 5-7.

Further, in this case, as depicted in FIG. 4, a current I1 that flows to the first transistor group 31 flows equally to the N-type transistors 31-1, 31-3, and 31-5 to 31-7 corresponding to the operating light emitting elements 5-1, 5-3, and 5-5 to 5-7.

Here, in the embodiment, the switches SW1 to SW8 are controlled such that the size of the operating first transistor group 31 and the size of the operating second transistor 32 are coincided with each other.

For example, as depicted in FIG. 4, the switches SW1 to SW8 are controlled by the control unit such that the switches SW1, SW3, and SW5 to SW7 corresponding to channels of the light emitting elements 5 which have been instructed to operate are caused to be conductive and the other switches SW2, SW4, and SW8 are caused to be non-conductive. Accordingly, the number of transistors of the first transistor group 31 that operate and the number of second transistors 32 that operate when the light emitting elements 5 operate are coincided with each other.

Accordingly, from the node 36 that is an output terminal of the operational amplifier 30, an output voltage Vo that is an average value of the operating voltages V1, V3, and V5 to V7 (for example, 2.2 V) inputted to the non-negated input terminals is outputted. This is because the output voltage Vo outputted from the operational amplifier 30 is fed back to the N-type transistors 31-1, 31-3, and 31-5 to 31-7 to which the current I1 flows equally.

Further, in the embodiment, the size of the first transistor group 31 that operates and the size of the second transistors 32 that operate are coincided with each other, and the average value of the operating voltages V1, V3, and V5 to V7 inputted to the non-negated input terminals can accordingly be suppressed from offsetting. Accordingly, according to the embodiment, an average value of operating voltages of the light emitting elements 5 that are operating can be outputted more accurately from the operational amplifier 30.

Figure 5:
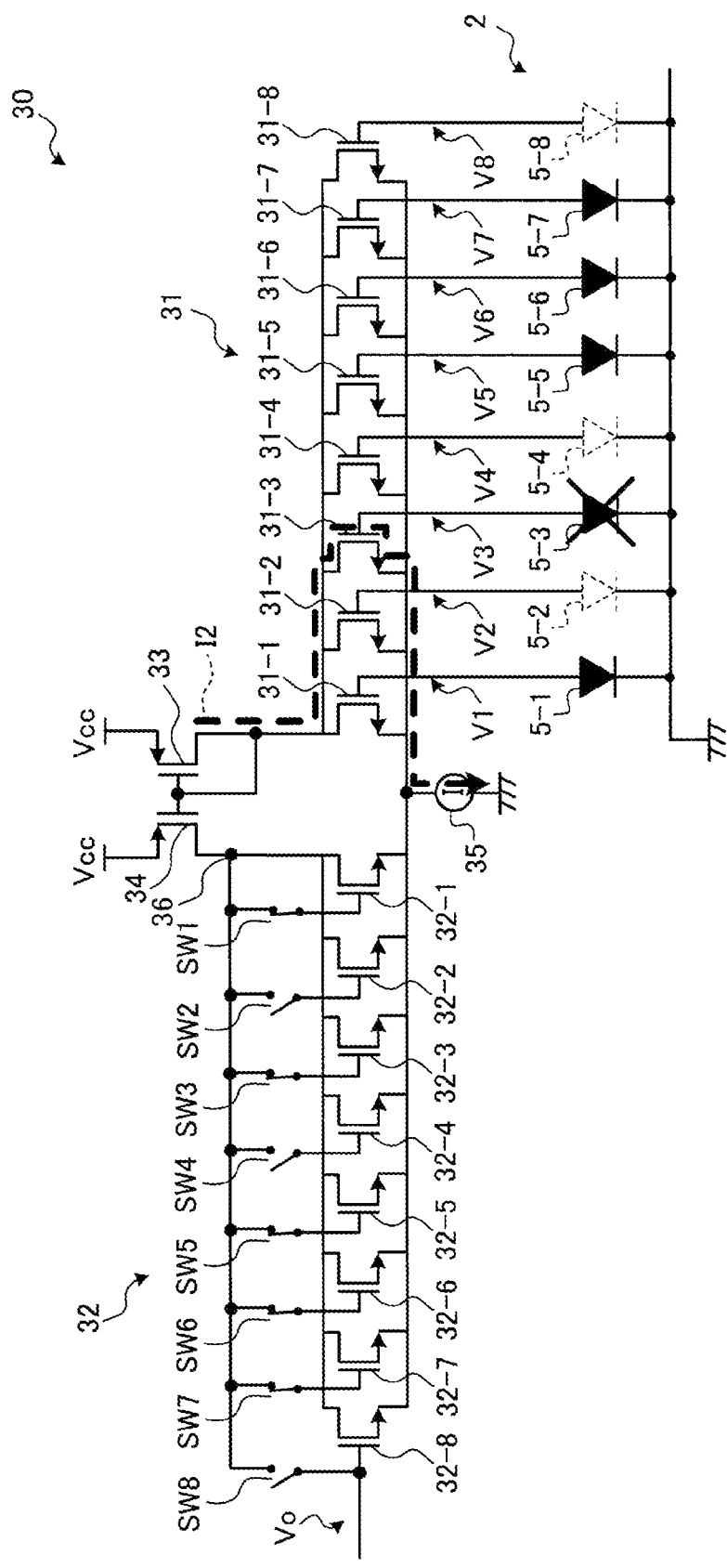
FIG. 5 is a circuit diagram depicting an example of operation of the operational amplifier in a case where a light emitting element according to the embodiment of the present disclosure is abnormal.

FIG. 5 is a circuit diagram depicting an example of operation of the operational amplifier 30 in the case where a light emitting element 5 according to the embodiment of the present disclosure is abnormal. In the example in FIG. 5, as in the example in FIG. 4, the control unit of the driving circuit 3 causes the light emitting elements 5-1, 5-3, and 5-5 to 5-7 to operate but does not cause the light emitting elements 5-2, 5-4, and 5-8 to operate. Further, in the example in FIG. 5, an abnormality occurs with the light emitting element 5-3.

Here, the operating voltages V1 and V5 to V7 of the light emitting elements 5-1 and 5-5 to 5-7 that operate normally are the operating voltages (for example, 2.2 V) in the case where they are normal. On the other hand, the operating voltage V3 of the light emitting element 5-3 that suffers from an abnormality has a value higher than that in the case where the all of the light emitting elements that operate are normal (for example, 2.7 V).

Further, in this case, as depicted in FIG. 5, a current I2 flowing to the first transistor group 31 flows in a concentrated manner to the N-type transistor 31-3 corresponding to the light emitting element 5-3 that suffers from the abnormality.

Accordingly, from the node 36 that is the output terminal of the operational amplifier 30, the output voltage Vo that has the value of the operating voltage V3 (for example, 2.7 V) inputted to the non-negated input terminal is outputted. This is because the output voltage Vo outputted from the operational amplifier 30 is fed back only to the N-tome transistor 31-3 to which the current I2 flows in a concentrated manner.

As described so far, in the case where ail of the operating voltages of plural light emitting elements 5 that operate are equal, the operational amplifier 30 according to the embodiment outputs an average value of the operating voltages of the plural light emitting elements 5 that operate as the output voltage Vo.

On the other hand, in the case where the operating voltage of a specific light emitting element 5 is higher than the operating voltages of the other light emitting elements 5 due to an abnormality or the like, the operational amplifier 30 according to the embodiment outputs the operating voltage of the specific light emitting element 5 as the output voltage Vo.

In particular, in the embodiment, in the case where an abnormality occurs with even one of a large number of light emitting elements 5, the output voltage Vo of the operational amplifier 30 increases. Accordingly, according to the embodiment, by monitoring the output voltage Vo from such an operational amplifier 30 as described above, in the case where an abnormality occurs with even one of the large number of light emitting elements 5, such an abnormality can be detected.

Referring back to FIG. 2, description of the detection circuit 20 according to the embodiment is given continuously. The output voltage Vo outputted from the operational amplifier 30 is inputted to a non-negated input terminal of a comparator 40. Meanwhile, to a negated input terminal of the comparator 40, a threshold voltage Vth of a predetermined value (for example, 2.7 V) is inputted from a voltage source 41.

Then, the comparator 40 generates a detection signal E1 by comparing the output voltage Vo inputted to the non-negated input terminal and the threshold voltage Vth inputted to the negated input terminal.

Accordingly, in a case where all of the plural light emitting elements 5 that operate are normal and the output voltage Vo of a value (for example, 2.2 V) lower than the threshold voltage Vth is outputted from the operational amplifier 30, the comparator 40 outputs the detection signal E1 of the low level.

On the other hand, in a case where an abnormality occurs with any of the plural light emitting elements 5 that operate and the output voltage Vo of a value (for example, 2.7 V) equal to or higher than the threshold voltage Vth is outputted from the operational amplifier 30, the comparator 40 outputs the detection signal E1 of the high level.

As described so far, by determining the output from the operational amplifier 30 by the comparator 40, in the case where an abnormality occurs with even one of a large number of light emitting elements 5, such an abnormality as just described can be detected simply and conveniently. It is to be noted that, in the embodiment, the value of the threshold voltage Vth is not limited to 2.7 V and can be set suitably on the basis of the operating voltage of the light emitting elements 5 or the like.

The output voltage Vo outputted from the operational amplifier 30 is further inputted to a non-negated input terminal of a comparator 50. Further, a negated input terminal and an output terminal of the comparator 50 are conductively connected to each other. In particular, since the comparator 50 has what is called a voltage follower configuration, the output voltage Vo is outputted as it is from the comparator 50.

The output voltage Vo outputted from the comparator 50 is inputted to the level shift circuit 60. The level shift circuit 60 includes the comparator 61 and resistors R1 to R4 all having an equal resistance value.

A non-negated input terminal of the comparator 61 is connected to the power supply voltage Vcc through the resistor R1 and is grounded through the resistor R2. Meanwhile, a negated input terminal of the comparator 61 is connected to the output terminal of the comparator 50 through the resistor R3. Further, an output terminal of the comparator 61 is connected to a negated input terminal of the comparator 61 through the resistor R4.

By inputting the output voltage Vo from the operational amplifier 30 to the level shift circuit 60 having such a configuration as just described, a differential voltage Vcc−Vo of the output voltage Vo from the power supply voltage Vcc is outputted from the level shift circuit 60.

Accordingly, in the embodiment, the control unit of the driving circuit 3 can suitably control the power supply voltage Vcc on the basis of such a differential voltage Vcc−Vo as described above, to reduce the power consumption of the driving circuit 3.

Further, in the embodiment, the comparator 50 that serves as a buffer is provided between the operational amplifier 30 and the level shift circuit 60 such that a current flowing through the resistors R3 and R4 of the level shift circuit 60 is supplied to the comparator 50 that serves as a buffer. Accordingly, the output error of the amplifier 30 can be suppressed.

[Various Modifications]

Figure 6:
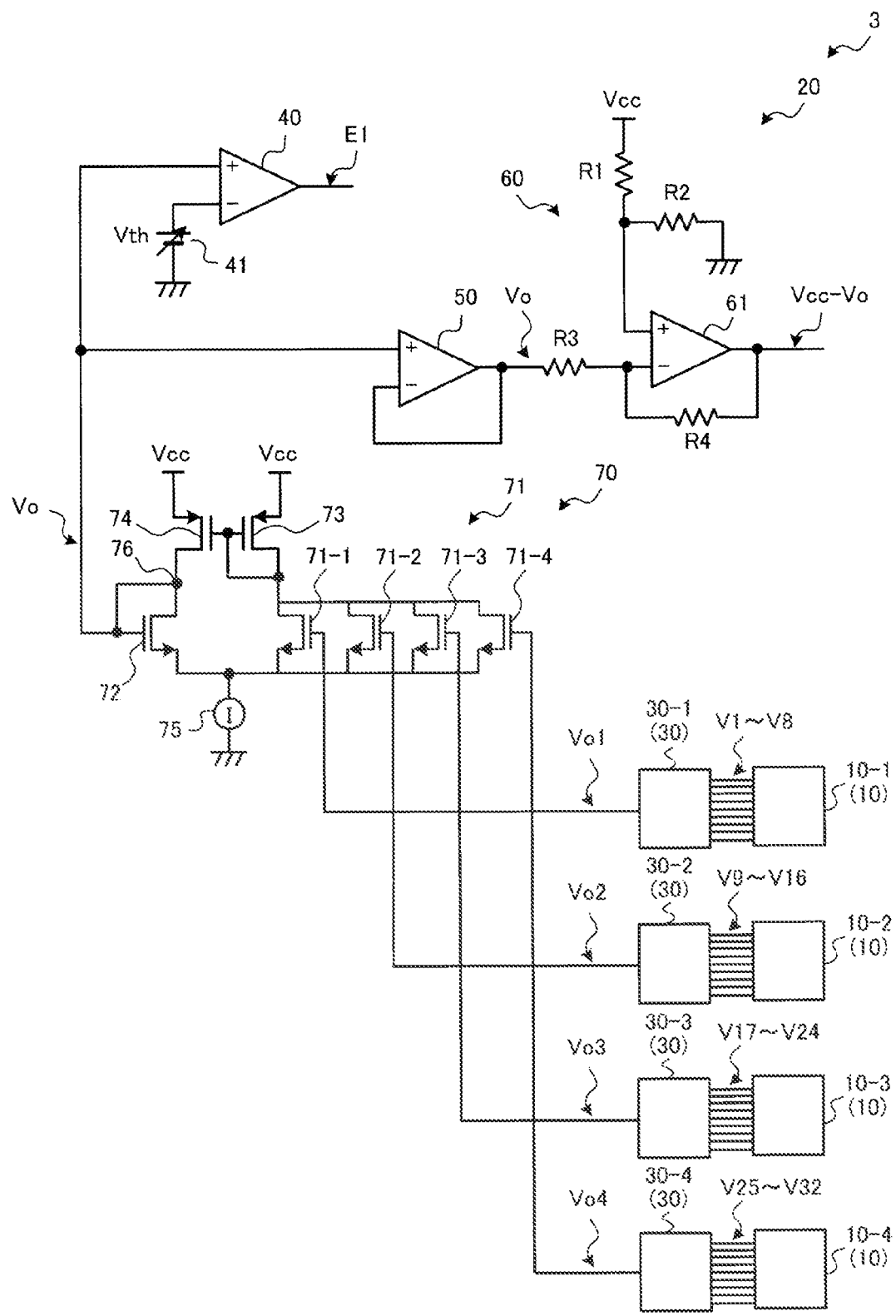
FIG. 6 is a circuit diagram depicting an example of a configuration of a driving circuit according to a modification 1 of the embodiment of the present disclosure.

Now, various modifications of the embodiment are described with reference to FIGS. 6 and 7. FIG. 6 is a circuit diagram depicting an example of a configuration of the driving circuit 3 according to a modification 1 of the embodiment of the present disclosure.

Figure 7:
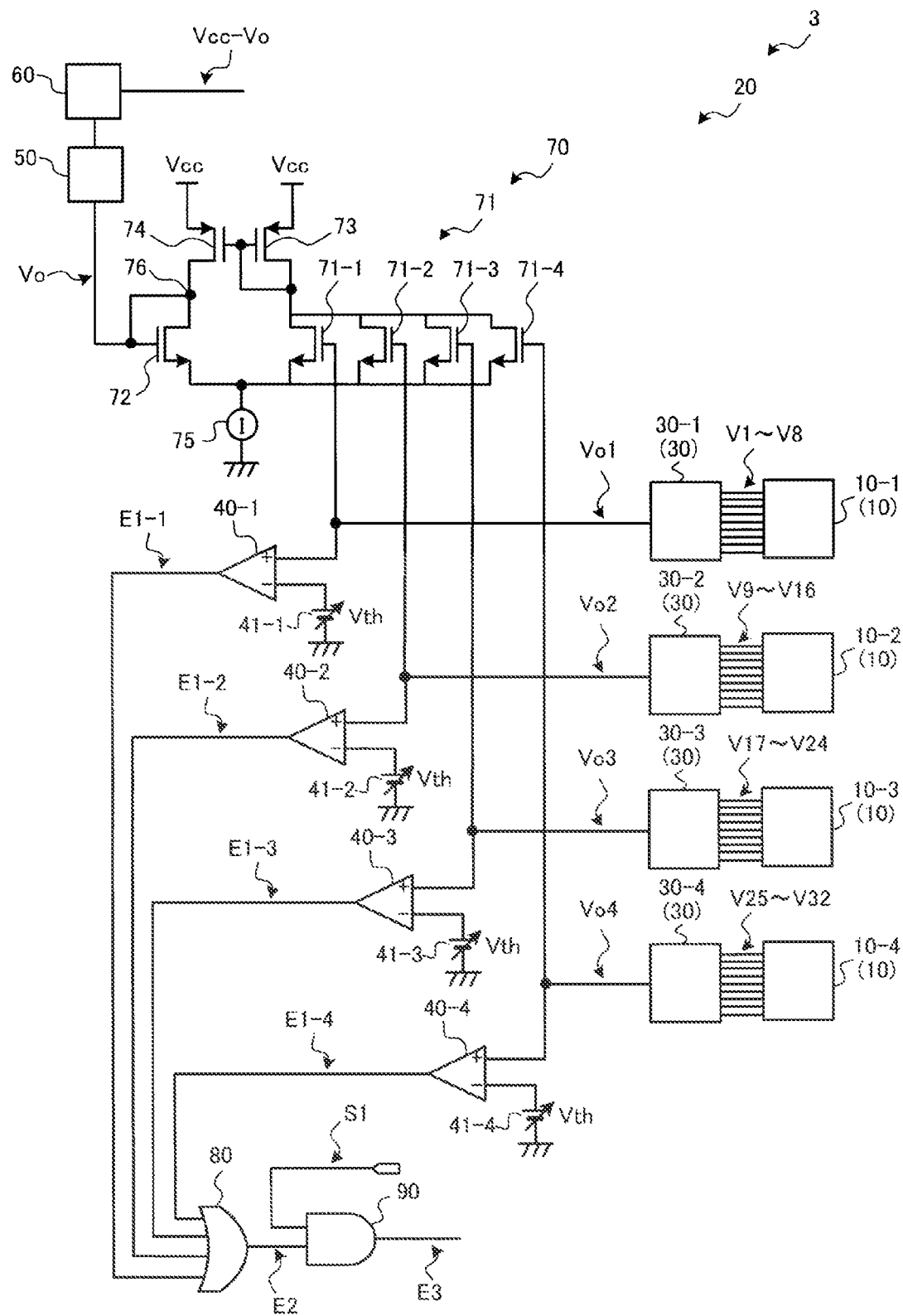
FIG. 7 is a circuit diagram depicting an example of a configuration of a driving circuit according to a modification 2 of the embodiment of the present disclosure.

It is to be noted that the examples in FIGS. 6 and 7 are directed to a case in which four driving units 10 for individually driving eight light emitting elements 5 not depicted are provided in the driving circuit 3 in order to facilitate understanding. Further, since the configuration of such four driving units 10 (hereinafter also referred to as driving units 10-1 to 10-4) is similar to that of the example in FIG. 2, illustration of the detailed configuration is omitted.

The detection circuit 20 of the modification 1 includes the same number of operational amplifiers 30 (hereinafter also referred to as operational amplifiers 30-1 to 30-4) as the number of a plurality of driving units 10, a later stage operational amplifier 70, comparators 40 and 50, and a level shift circuit 60.

In the modification 1, operating voltages V1 to V8 of the eight light emitting elements 5 are outputted from the driving unit 10-1 and inputted to the operational amplifier 30-1. Then, from the operational amplifier 30-1, an output voltage Vo1 is outputted on the basis of the operating voltages V1 to V8.

Similarly, operating voltages V9 to V16 of the eight light emitting elements 5 are outputted from the driving unit 10-2 and inputted to the operational amplifier 30-2. Then, from the operational amplifier 30-2, an output voltage Vo2 is outputted on the basis of the operating voltages V9 to V16.

Further, operating voltages V17 to V24 of the eight light emitting elements 5 are outputted from the driving unit 10-3 and inputted to the operational amplifier 30-3. Then, from the operational amplifier 30-3, an output voltage Vo3 is outputted on the basis of the operating voltages V17 to V24.

Further, operating voltages V25 to V32 of the eight light emitting elements 5 are outputted from the driving unit 10-4 and inputted to the operational amplifier 30-4. Then, from the operational amplifier 30-4, an output voltage Vo4 is outputted on the basis of the operating voltages V25 to V32.

The output voltages Vo1 to Vo4 outputted from the operational amplifiers 30-1 to 30-4 are inputted to the later stage operational amplifier 70. The later stage operational amplifier 70 has a configuration similar to that of the operational amplifier 30. In particular, the later stage operational amplifier 70 is a multiple-input one-output operational amplifier, and a third transistor group 71 and a fourth transistor 72 have a differential configuration relative to each other.

The third transistor group 71 includes the same number of N-type transistors 71-1 to 71-4 as the number of the plurality of operational amplifiers 30, the N-type transistors 71-1 to 71-4 being connected in parallel. To drains of the N-type transistors 71-1 to 71-4, the power supply voltage Vcc is supplied through a P-type transistor 73. Meanwhile, sources of the N-type transistors 71-1 to 71-4 are grounded through a constant current source 75.

The fourth transistor 72 includes an N-type transistor. To a drain of the fourth transistor 72, the power supply voltage Vcc is supplied through a P-type transistor 74. Meanwhile, a source of the fourth transistor 72 is grounded through the constant current source 75, and a gate of the fourth transistor 72 is connected to a node 76 between a drain of the P-type transistor 74 and the drain of the fourth transistor 72.

Further, a gate of the P-type transistor 73 and a gate of the P-type transistor 74 are connected in common to a portion between a drain of the P-type transistor 73 and drains of the N-tome transistors 71-1 to 71-4. It is to be noted that the P-type transistor 73 and the P-type transistor 74 have sizes equal to each other.

As described so far, in the later stage operational amplifier 70 of the modification 1, the output voltages Vo1 to Vo4 outputted from the operational amplifiers 30 are respectively inputted to gates of the N-type transistors 71-1 to 71-4 (third transistor group 71), the gates being the non-negated input terminals. Further, in the later stage operational amplifier 70, an output thereof is negatively fed back from the node 76 that is an output terminal to the gate of the fourth transistor 72, the gate being a negated input terminal of the later stage operational amplifier 70.

Accordingly, in a case where the operating voltages of the light emitting elements 5 that operate among the 32 light emitting elements 5 are all equal to each other, the later stage operational amplifier 70 outputs an average value of the operating voltages of the light emitting elements 5 that operate as an output voltage Vo.

On the other hand, in a case where the operating voltage of a specific light emitting element 5 is higher than the operating voltages of the other light emitting elements 5 due to an abnormality thereof or the like, the later stage operational amplifier 70 outputs the operating voltage of the specific light emitting element 5 as an output voltage Vu.

For example, in the case where the operating voltage of a specific light emitting element 5 among the plural light emitting elements 5 that are driven by the driving unit 10-1 is higher than the operating voltages of the other light emitting elements 5, the operating voltage of the specific light emitting element 5 is outputted as the output voltage Vo1 from the operational amplifier 30-1.

Then, since the output voltage Vo1 has a value higher than the output voltages Vo2 to Vo4 of the other operational amplifiers 30-2 to 30-4, the output voltage Vo1 that has a higher value than the other values is outputted as the output voltage Vo from the later stage operational amplifier 70.

In particular, in the modification 1, in the case where an abnormality occurs with even one of the large number of light emitting elements 5, the output voltage Vo from the later stage operational amplifier 70 increases. Accordingly, with the modification 1, by monitoring the output voltage Vo from the later stage operational amplifier 70, in the case where an abnormality occurs with even one of the large number of light emitting elements 5, the abnormality can be detected simply and conveniently.

Further, in the modification 1, by determining the output from the later stage operational amplifier 70 using the comparator 40, in the case where an abnormality occurs with even one of the large number of light emitting elements 5, the abnormality can be detected simply and conveniently, as in the embodiment.

Furthermore, in the modification 1, the output voltage Vo outputted from the later stage operational amplifier 70 is inputted to the level shift circuit 60 through the comparator 50, as in the embodiment. Accordingly, from the level shift circuit 60, the differential voltage Vcc−Vo of the output voltage Vo from the power supply voltage Vcc is outputted.

Accordingly, in the modification 1, the power consumption of the driving circuit 3 can be reduced by the control unit of the driving circuit 3 suitably controlling the power supply voltage Vcc, on the basis of such a differential voltage Vcc−Vo as just described.

It is to be noted that, to the later stage operational amplifier 70 of the modification 1, the output voltages Vo1 to Vo4 from all of the operational amplifiers 30-1 to 30-4 are inputted in many cases. Accordingly, in the modification 1, different from the operational amplifier 30 of the embodiment, there is no necessity to have the fourth transistor 72 include a plurality of transistors and a plurality of switches, and it is sufficient if the fourth transistor 72 is configured so as to have a size equal to the total size of the N-type transistors 71-1 to 71-4.

Since this can make the configuration of the later stage operational amplifier 70 simple and convenient, the production cost of the driving circuit 3 can be reduced.

On the other hand, the fourth transistor 72 of the later stage operational amplifier 70 may include a plurality of transistors and a plurality of switches like the operational amplifier 30 of the embodiment depicted in FIG. 3 and so forth. By this, an average value of the operating voltages of all of the light emitting elements 5 that are operating can be outputted with a higher degree of accuracy from the later stage operational amplifier 70.

FIG. 7 is a circuit diagram depicting an example of a configuration of the driving circuit 3 according to a modification 2 of the embodiment of the present disclosure. The modification 2 is similar to the modification 1 in that the output voltage Vo from the later stage operational amplifier 70 is outputted as the differential voltage Vcc−Vo through the comparator 50 and the level shift circuit 60. It is to be noted that, since the comparator 50 and the level shift circuit 60 in FIG. 7 are similar in configuration to those of the example in FIG. 6, illustration of a detailed configuration of them is omitted.

On the other hand, the modification 2 is different from the modification 1 in the configuration of the comparator 40 that detects an abnormality of a light emitting element 5. In the driving circuit 3 of such a modification 2 as just described, the same number of comparators 40-1 to 40-4 as the number of plural operational amplifiers 30-1 to 30-4, an OR circuit 80, and an AND circuit 90 are provided separately.

The output voltage Vo1 outputted from the operational amplifier 30-1 is inputted to a non-negated input terminal of the comparator 40-1. Meanwhile, to a negated input terminal of the comparator 40-1, a threshold voltage with of a predetermined value (for example, 2.7 V) is inputted from a voltage source 41-1.

Then, the comparator 40-1 generates a detection signal E1-1 by comparing the output voltage Vo1 inputted to the non-negated input terminal and the threshold voltage Vth inputted to the negated input terminal with each other.

Accordingly, in a case where all of plural light emitting elements 5 that are driven by the driving unit 10-1 are normal and the output voltage Vo1 of a value lower than the threshold voltage Vth is outputted from the operational amplifier 30-1, the comparator 40-1 outputs the detection signal E1-1 of the low level.

On the other hand, in a case where an abnormality occurs with any of plural light emitting elements 5 that are driven by the driving unit 10-1 and the output voltage Vo1 of a value equal to or higher than the threshold voltage Vth is outputted from the operational amplifier 30-1, the comparator 40-1 outputs the detection signal E1-1 of the high level.

Similarly, the comparators 40-2 to 40-4 generate detection signals E1-2 to E1-4 by comparing the output voltages Vo2 to Vo4 inputted to the non-negated input terminals and the threshold voltage Vth inputted to the negated input terminals from voltage sources 41-2 to 41-4 with each other, respectively.

Accordingly, in a case where all of plural light emitting elements 5 that are driven by the driving units 10-2 to 10-4 are normal, the output voltages Vo2 to Vo4 of values lower than the threshold voltage Vth are outputted from the operational amplifiers 30-2 to 30-4, respectively. In this case, the comparators 40-2 to 40-4 output the detection signals E1-2 to E1-4 of the low level, respectively.

On the other hand, in a case where an abnormality occurs with any of plural light emitting elements 5 that are driven by the driving units 10-2 to 10-4, the output voltages Vo1 to Vo4 each having a value equal to or higher than the threshold voltage Vth are outputted from at least one of the operational amplifiers 30-2 to 30-4. In this case, at least one of the comparators 40-2 to 40-4 outputs the detection signals E1-2 to E1-4 of the high level.

Then, the detection signals E1-1 to E1-4 outputted from the comparators 40-1 to 40-4 are inputted to the OR circuit 80. Accordingly, in the case where all of plural light emitting elements 5 that are driven by the driving units 10-1 to 10-4 are normal, the OR circuit 80 outputs the detection signal E2 of the low level.

On the other hand, in the case where an abnormality occurs with any of the plural light emitting elements 5 that are driven by the driving units 10-1 to 10-4, the OR circuit 80 outputs the detection signal P2 of the high level.

Then, the detection signal P2 outputted from the OR circuit 80 is inputted to the AND circuit 90. Further, to the AND circuit 90, a signal S1 is inputted. The signal 31 indicates the high level in a case where an abnormality detection mode for the light emitting elements 5 is validated but indicates the low level in a case where the abnormality detection mode for the light emitting elements 5 is invalidated.

Accordingly, in a case where the abnormality detection mode for plural light emitting elements 5 is validated and besides the detection signal E2 of the high level is inputted, the AND circuit 90 outputs a detection signal E3 of the high level.

As described so far, in the modification 2, abnormality detection of a light emitting element 5 is carried out not on the basis of the out voltage Vo from the later stage operational amplifier 70 but on the basis of the output voltages Vo1 to Vo4 from the operational amplifiers 30-1 to 30-4 at the preceding stage. Accordingly, since an abnormality can be detected on the basis of the output, voltages Vo1 to Vo4 outputted from locations nearer to the plural light emitting elements 5, abnormality detection can be implemented with high accuracy.

Further, in the modification 2, the AND circuit 90 is additionally provided such that abnormality detect on is carried out only in the case where the abnormality detection mode for the light emitting elements 5 is validated. Accordingly, in a case where, for example, in a transition state when the driving circuit 3 starts operation, the operating voltages for the plural light emitting elements 5 are not stable, such a situation that abnormality of one or more light emitting elements 5 is erroneously detected can be suppressed. It is to be noted that such an AND circuit 90 as just described may be provided otherwise at a succeeding stage to the comparator 40 in the embodiment or the modification 1.

It is to be noted that, in the modifications 1 and 2 described above, an example in which, in the case where 32 light emitting elements 5 are operated by the driving circuit 3, four driving units 10 and four operational amplifiers 30 are provided has been described. In the meantime, in the present disclosure, the numbers of the light emitting elements 5, driving units 10, and operational amplifiers 30 are not limited to those in such an example as described above.

For example, in a case where 800 light emitting elements 5 are provided in the light emitting element array 2, 16 driving units 10 and 16 operational amplifiers 30 may be provided in the driving circuit 3 such that one driving unit 10 and one operational amplifier 30 are connected to each 50 light emitting elements 5.

Further, in the embodiment described above, indicated is an example in which the driving unit 10 includes P-type transistors and drives plural light emitting elements 5 whose cathodes are connected in common while all of the first transistor group 31 and the second transistors 32 include N-type transistors.

On the other hand, according to the present disclosure, the driving unit 10 may otherwise include N-type transistors and drive plural light emitting elements 5 whose anodes are connected in common while all of the first transistor group 31 and the second transistors 32 include P-type transistors.

It is to be noted that the advantageous effects described in the present specification are exemplary to the last and are not restrictive, and some other effects may be applicable.

It is to be noted that the present technology can also take such configurations as described below.

(1)

A detection circuit including:

a multiple-input one-output operational amplifier including a first transistor group including plural transistors connected in parallel such that operating voltages for plural light emitting elements are inputted individually to gates of the plural transistors, the gates being non-negated input terminals of the operational amplifier, and a second transistor cooperating with the first transistor group to form a differential configuration and having a gate which is a negated input terminal of the operational amplifier and to which an output from an output terminal is negatively fed back.

(2)

The detection circuit according to (1) above, in which the second transistor includes plural transistors connected in parallel, and the detection circuit further includes a control unit configured to control a connection state of the plural transistors of the second transistor such that a size of the first transistor group and a size of the second transistor coincide with each other.

(3)

The detection circuit according to (1) or (2) above, further including:

a comparator configured to compare an output voltage outputted from the operational amplifier and a predetermined threshold voltage with each other.

(4)

The detection circuit according to any one of (1) to (3) above, further including:

a plurality of the operational amplifiers; and a multiple-input one-output later stage operational amplifier including a third transistor group including plural transistors connected in parallel such that outputs of the plurality of operational amplifiers are inputted individually to gates of the plural transistors, the gates being non-negated input terminals of the later stage operational amplifier, and a fourth transistor cooperating with the third transistor group to form a differential configuration and having a gate which is a negated input terminal of the later stage operational amplifier and to which an output from an output terminal is negatively fed back.

(5)

The detection circuit according to (4) above, further including:

a comparator configured to compare an output voltage outputted from the later stage operational amplifier and a predetermined threshold value with each other.

(6)

The detection circuit according to (4) above, further including:

plural comparators configured to individually compare output voltages outputted from the plurality of operational amplifiers and a predetermined threshold value with each other, (7)

A driving circuit including:

a driving unit configured to drive plural light emitting elements; and a multiple-input one-output operational amplifier including a first transistor group including plural transistors connected in parallel such that operating voltages for the plural light emitting elements are inputted individually to gates of the plural transistors, the gates being non-negated input terminals of the operational amplifier, and a second transistor cooperating with the first transistor group to form a differential configuration and having a gate which is a negated input terminal of the operational amplifier and to which an output from an output terminal is negatively fed back.

(8)

The driving circuit according to (7) above, in which the driving unit includes a P-type transistor and drives the plural light emitting elements whose cathodes are connected in common, and the plural transistors of the first transistor group and the second transistor all include N-type transistors.

(9)

The driving circuit according to (7) above, in which the driving unit includes a N-type transistor and drives the plural light emitting elements whose anodes are connected in common, and the plural transistors of the first transistor group and the second transistor all include P-type transistors.

(10)

A light emitting device including:

a light emitting element array in which plural light emitting elements are provided;

a driving unit configured to drive the plural light emitting elements of the light emitting element array; and a multiple-input one-output operational amplifier including a first transistor group including plural transistors connected in parallel such that operating voltages for the plural light emitting elements are inputted individually to gates of the plural transistors, the gates being non-negated input terminals of the operational amplifier, and a second transistor cooperating with the first transistor group to form a differential configuration and having a gate which is a negated input terminal of the operational amplifier and to which an output from an output terminal is negatively fed back.

REFERENCE SIGNS LIST

1: Light emitting device
2: Light emitting element array
3: Driving circuit
5, 5-1 to 5-8: Light emitting element
10: Driving unit
20: Detection circuit
30: Operational amplifier
31: First transistor group
32: Second transistor
40, 40-1 to 40-4: Comparator
70: Later stage operational amplifier
71: Third transistor group
72: Fourth transistor
V1 to V32: Operating voltage
Vo: Output voltage

The invention claimed is:

1. A detection circuit comprising:
a multiple-input one-output operational amplifier including
    a first transistor group including plural transistors connected in parallel such that operating voltages for plural light emitting elements are inputted individually to gates of the plural transistors, the gates being non-negated input terminals of the operational amplifier, and
    a second transistor cooperating with the first transistor group to form a differential configuration and having a gate which is a negated input terminal of the operational amplifier and to which an output from an output terminal is negatively fed back.

2. The detection circuit according to claim 1, wherein the second transistor includes plural transistors connected in parallel, and
the detection circuit further includes a control unit configured to control a connection state of the plural transistors of the second transistor such that a size of the first transistor group and a size of the second transistor coincide with each other.

3. The detection circuit according to claim 1, further comprising:
a comparator configured to compare an output voltage outputted from the operational amplifier and a predetermined threshold voltage with each other.

4. The detection circuit according to claim 1, further comprising:
a plurality of the operational amplifiers; and
a multiple-input one-output later stage operational amplifier including a third transistor group including plural transistors connected in parallel such that outputs of the plurality of operational amplifiers are inputted individually to gates of the plural transistors, the gates being non-negated input terminals of the later stage operational amplifier, and a fourth transistor cooperating with the third transistor group to form a differential configuration and having a gate which is a negated input terminal of the later stage operational amplifier and to which an output from an output terminal is negatively fed back.

5. The detection circuit according to claim 4, further comprising:
a comparator configured to compare an output voltage outputted from the later stage operational amplifier and a predetermined threshold value with each other.

6. The detection circuit according to claim 4, further comprising:
plural comparators configured to individually compare output voltages outputted from the plurality of operational amplifiers and a predetermined threshold value with each other.

7. A driving circuit comprising:
a driving unit configured to drive plural light emitting elements; and
a multiple-input one-output operational amplifier including a first transistor group including plural transistors connected in parallel such that operating voltages for the plural light emitting elements are inputted individually to gates of the plural transistors, the gates being non-negated input terminals of the operational amplifier, and a second transistor cooperating with the first transistor group to form a differential configuration and having a gate which is a negated input terminal of the operational amplifier and to which an output from an output terminal is negatively fed back.

8. The driving circuit according to claim 7, wherein
the driving unit includes a P-type transistor and drives the plural light emitting elements whose cathodes are connected in common, and
the plural transistors of the first transistor group and the second transistor all include N-type transistors.

9. The driving circuit according to claim 7, wherein
the driving unit includes a N-type transistor and drives the plural light emitting elements whose anodes are connected in common, and
the plural transistors of the first transistor group and the second transistor all include P-type transistors.

10. A light emitting device comprising:
a light emitting element array in which plural light emitting elements are provided;
a driving unit configured to drive the plural light emitting elements of the light emitting element array; and
a multiple-input one-output operational amplifier including a first transistor group including plural transistors connected in parallel such that operating voltages for the plural light emitting elements are inputted individually to gates of the plural transistors, the gates being non-negated input terminals of the operational amplifier, and a second transistor cooperating with the first transistor group to form a differential configuration and having a gate which is a negated input terminal of the operational amplifier and to which as output from an output terminal is negatively fed back.

* * * * *